(12) United States Patent
Chiu

(10) Patent No.: US 12,356,591 B2
(45) Date of Patent: Jul. 8, 2025

(54) MILLIMETER WAVE COMMUNICATION APPARATUS

(71) Applicant: GETAC TECHNOLOGY CORPORATION, New Taipei (TW)

(72) Inventor: Shang-Ming Chiu, Taipei (TW)

(73) Assignee: Getac Technology Corporation, New Taipei (TW)

( * ) Notice: Subject to any disclaimer, the term of this patent is extended or adjusted under 35 U.S.C. 154(b) by 448 days.

(21) Appl. No.: 17/980,494

(22) Filed: Nov. 3, 2022

(65) Prior Publication Data

US 2023/0403046 A1    Dec. 14, 2023

Related U.S. Application Data

(60) Provisional application No. 63/351,425, filed on Jun. 12, 2022.

(51) Int. Cl.
*H04B 5/00*       (2024.01)
*G06F 1/20*       (2006.01)
(Continued)

(52) U.S. Cl.
CPC ......... *H05K 7/20481* (2013.01); *G06F 1/203* (2013.01); *G06K 19/0723* (2013.01);
(Continued)

(58) Field of Classification Search
None
See application file for complete search history.

(56) References Cited

U.S. PATENT DOCUMENTS

| 7,068,229 B2* | 6/2006 | Lin | G06F 1/1698 |
| | | | 343/702 |
| 7,099,632 B2* | 8/2006 | Hong | H04M 1/0216 |
| | | | 343/702 |

(Continued)

FOREIGN PATENT DOCUMENTS

| KR | 1020130006820 A | 1/2013 |
| TW | M596462 U | 6/2020 |

OTHER PUBLICATIONS

European Patent Office, Search Report, Application No. 22209637.2, May 15, 2023, Germany.

(Continued)

*Primary Examiner* — Tuan A Tran
(74) *Attorney, Agent, or Firm* — Cooper Legal Group, LLC

(57) ABSTRACT

A millimeter wave communication apparatus includes: an electronic device, including a first waveguide connection port disposed on a casing of the electronic device, and a millimeter wave communication module connected to the first waveguide connection port to transmit and receive millimeter-wave signals; and an expansion device, installed on a carrier, and including a second waveguide connection port disposed on a casing of the expansion device and corresponding to a position of the first waveguide connection port of the electronic device, and at least one millimeter-wave antenna connected to the second waveguide connection port to transmit and receive the millimeter-wave signals. When the electronic device is fastened on the expansion device, the first waveguide connection port and the second waveguide connection port form a waveguide to transmit and receive the millimeter-wave signals. Therefore, attenuation of the millimeter-wave signals is avoided.

20 Claims, 3 Drawing Sheets

(51) Int. Cl.
- *G06K 19/07* (2006.01)
- *H01P 1/04* (2006.01)
- *H01Q 1/02* (2006.01)
- *H04B 1/00* (2006.01)
- *H04B 1/16* (2006.01)
- *H04B 5/72* (2024.01)
- *H04B 5/73* (2024.01)
- *H05K 1/02* (2006.01)
- *H05K 7/00* (2006.01)
- *H05K 7/20* (2006.01)

(52) U.S. Cl.
CPC ............. *H01Q 1/02* (2013.01); *H04B 1/0057* (2013.01); *H04B 1/16* (2013.01); *H04B 5/72* (2024.01); *H04B 5/73* (2024.01); *H05K 1/0203* (2013.01)

(56) References Cited

U.S. PATENT DOCUMENTS

| | | | |
|---|---|---|---|
| 7,184,617 B2* | 2/2007 | Korenaga | G02B 6/3608 385/32 |
| 7,199,762 B2* | 4/2007 | Liu | H01Q 1/243 343/702 |
| 7,557,761 B2* | 7/2009 | Iwai | H01Q 5/321 343/702 |
| 7,589,687 B2* | 9/2009 | Iwai | H01Q 3/28 343/702 |
| 7,733,276 B2* | 6/2010 | Levy | G06F 1/1616 343/702 |
| 8,089,411 B2* | 1/2012 | Shimasaki | G06F 1/1698 343/702 |
| 8,274,434 B2* | 9/2012 | Kusaka | G06F 1/1683 343/702 |
| 8,295,899 B2* | 10/2012 | Hashizume | H05K 1/148 455/575.3 |
| 8,519,894 B2* | 8/2013 | Yang | H01Q 1/2266 343/702 |
| 8,718,724 B2* | 5/2014 | Fuke | H04M 1/18 455/575.3 |
| 8,754,820 B2* | 6/2014 | Iwai | H01Q 1/243 343/702 |
| 9,048,959 B2* | 6/2015 | Voutilainen | H04M 1/72409 |
| 9,065,162 B2* | 6/2015 | Runyon | H01Q 1/28 |
| 9,166,269 B2* | 10/2015 | Haroun | H01Q 13/02 |
| 9,209,851 B1* | 12/2015 | Wilmhoff | H04B 5/24 |
| 9,437,919 B2* | 9/2016 | Shimasaki | H01Q 21/28 |
| 9,660,336 B2* | 5/2017 | Anderson | G01R 33/283 |
| 10,164,307 B2* | 12/2018 | Gomi | H01P 1/022 |
| 10,338,873 B2* | 7/2019 | Lagnado | G08C 17/02 |
| 2011/0194240 A1* | 8/2011 | Hansen | H01Q 1/2266 361/679.01 |
| 2021/0048843 A1 | 2/2021 | LIn et al. | |

OTHER PUBLICATIONS

Naser Ojaroudi Parchin et al., "UWB MM-Wave Antenna Array with Quasi Omnidirectional Beams for 5G 1 Handheld Devices", 2016 IEEE International Conference on Ubiquitous Wireless Broadband (ICUWB), 2016, 5 pages.

* cited by examiner

MILLIMETER WAVE COMMUNICATION APPARATUS

The application claims priority to U.S. Provisional Application No. 63/351,425, filed on Jun. 12, 2022, the disclosure of which is hereby incorporated by reference herein in its entirety.

BACKGROUND OF THE INVENTION

Field of the Invention

The present invention relates to a communication apparatus and, more particularly, to a millimeter wave communication apparatus.

Description of the Prior Art

A millimeter-wave antenna has many limitations in terms of space and transmission when placed in a laptop or tablet computer, for example, space limitations with respect to antenna placement and signal attenuation on transmission paths. Thus, there is a need for a design for an expansion device for placing a millimeter-wave antenna and at the same time avoiding attenuation of millimeter-wave signals.

SUMMARY OF THE INVENTION

The present invention provides a millimeter wave communication apparatus including an expansion device for placing a millimeter-wave antenna and at the same time capable of avoiding attenuation of millimeter-wave signals.

The millimeter wave communication apparatus provided by the present invention includes: an electronic device and an expansion device. The electronic device includes a first waveguide connection port and a millimeter wave communication module, wherein the first waveguide connection port is disposed on a casing of the electronic device, and the millimeter wave communication module is connected to the first waveguide connection port to transmit and receive millimeter-wave signals. The expansion device is installed on a carrier, and includes a second waveguide connection port and at least one millimeter-wave antenna, wherein the second waveguide connection port is disposed on a casing of the expansion device and corresponds to a position of the first waveguide connection port of the electronic device, and the at least one millimeter-wave antenna is connected to the second waveguide connection port to transmit and receive the millimeter-wave signals. When the electronic device is fastened on the expansion device, the first waveguide connection port and the second waveguide connection port form a waveguide to transmit and receive the millimeter-wave signals.

In one embodiment of the present invention, the electronic device is a tablet computer or a laptop computer.

In one embodiment of the present invention, the expansion device has a fastening structure for securing the electronic device.

In one embodiment of the present invention, the expansion device is fixed on the carrier.

In one embodiment of the present invention, the at least one millimeter-wave antenna is installed on a top portion, a left side or a right side of the expansion device.

In one embodiment of the present invention, the first waveguide connection port has a first port, and the second waveguide connection port has a second port.

In one embodiment of the present invention, when the electronic device is fastened on the expansion device, the first port of the first waveguide connection port and the second port of the second waveguide connection port are correspondingly connected, such that the first waveguide connection port and the second waveguide connection port form a waveguide to transmit and receive millimeter-wave signals.

With the expansion device and the multiple waveguide connection ports used in the present invention, a millimeter-wave antenna can be placed on the expansion device, and a waveguide can be formed by the multiple waveguide connection ports to transmit millimeter-wave signals. Therefore, the issues of space limitations in the design of the millimeter-wave antenna as well as the attenuation of millimeter-wave signals can be avoided.

To better understand the above and other objects, features and advantages of the present invention, embodiments are described in detail with the accompanying drawings below.

DETAILED DESCRIPTION OF THE EMBODIMENTS

Figure 1:
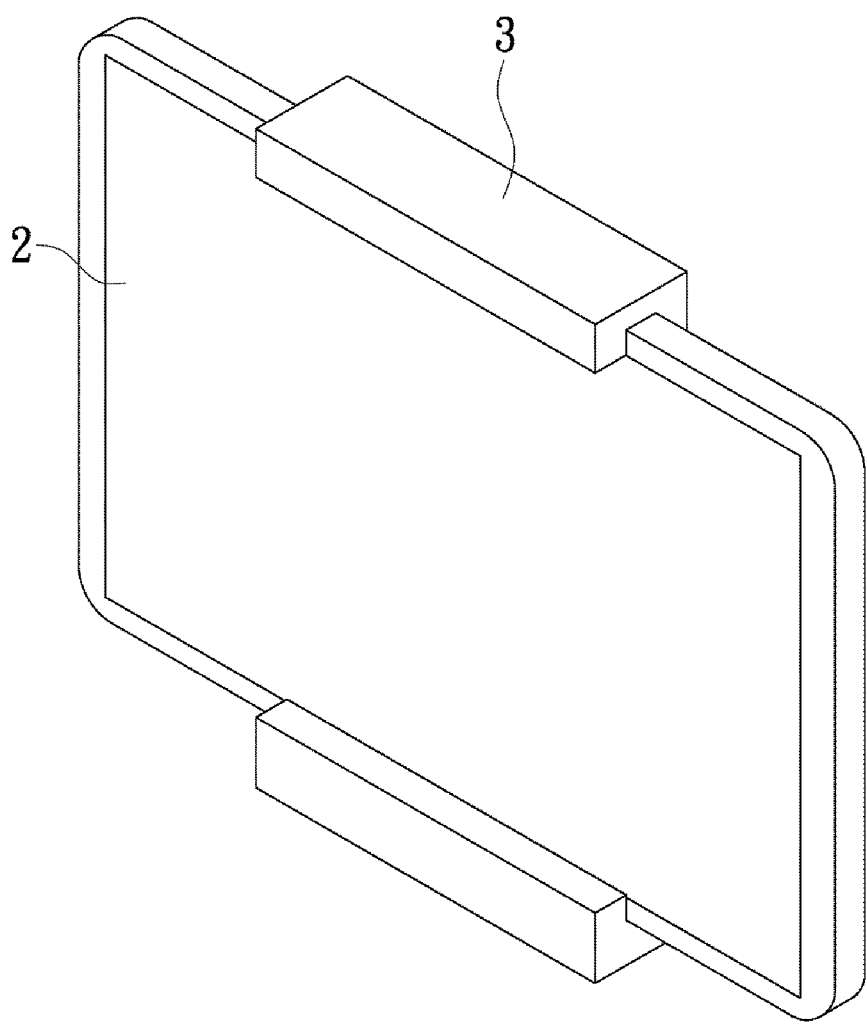
FIG. 1 is a first schematic diagram of a millimeter wave communication apparatus provided by an embodiment of the present invention.

Refer to FIG. 1 showing a first schematic diagram of a millimeter wave communication apparatus provided by an embodiment of the present invention. A millimeter wave communication apparatus 1 provided by the present invention includes an electronic device 2 and an expansion device 3. The electronic device 2 may be a portable computer such as a tablet computer or a laptop computer, or other portable electronic devices, and is exemplified by a tablet computer in this embodiment; however, the present invention is not limited to the examples above. The expansion device 3 may be installed on a carrier such as a vehicle, for example but not limited to, fixedly disposed on the carrier or removable from the carrier. Moreover, the expansion device 3 has a fastening structure for securing the electronic device 2 so as to prevent the electronic device 2 from shaking or falling off. The fastening structure is illustrative, and may be, for example but not limited to, other structures that can be fastened, fixed or detached.

Figure 2:
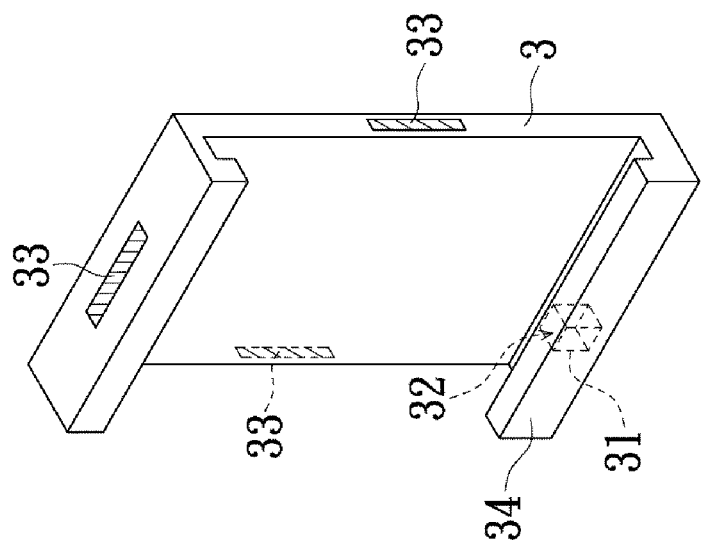
FIG. 2 is a second schematic diagram of a millimeter wave communication apparatus provided by an embodiment of the present invention.
Figure 2:
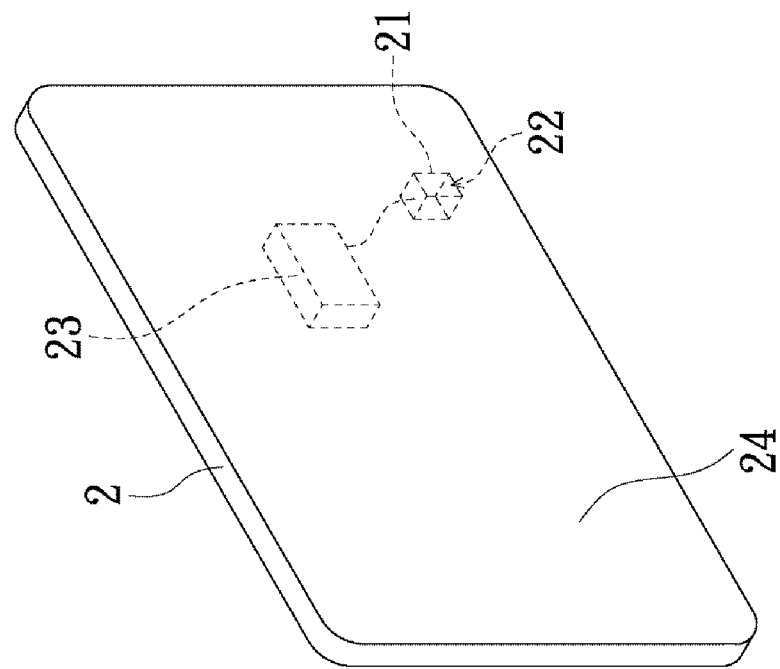
Figure 3:
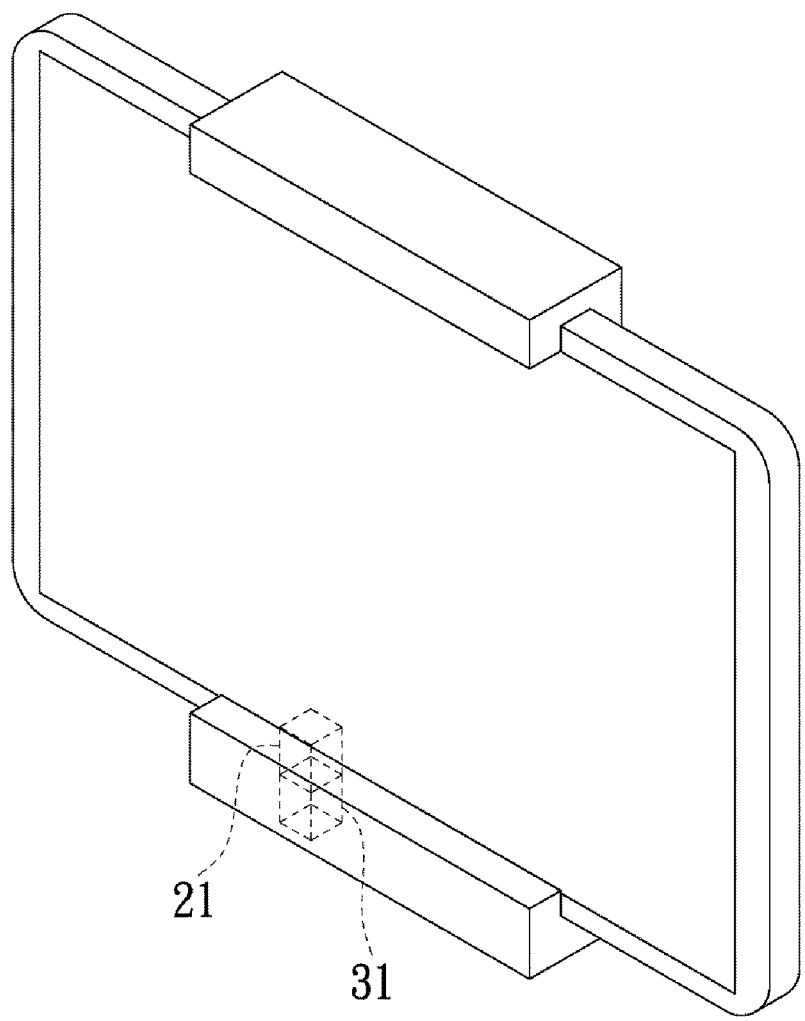
FIG. 3 is a third schematic diagram of a millimeter wave communication apparatus provided by an embodiment of the present invention.

Refer to FIG. 2 and FIG. 3 respectively showing second and third schematic diagrams of a millimeter wave communication apparatus provided by an embodiment of the present invention. The electronic device 2 includes a first waveguide connection port 21 and a millimeter wave communication module 23. The first waveguide connection portion 21 has a port 22 and is disposed on a casing 24 of the electronic device 2. The millimeter wave communication module 23 is connected to the first waveguide connection port 21 to transmit and receive millimeter-wave signals. The expansion device 3 includes a second waveguide connection port 31 and at least one millimeter-wave antenna 33. The second waveguide connection port 31 has a port 32 and is disposed on a casing 34 of the expansion device 3 so as to correspond to a position of the port 22 of the first waveguide connection port 21 of the electronic device 2. The at least one millimeter-wave antenna 33 is connected to the second waveguide connection port 31 to transmit and receive millimeter-wave signals. It should be noted that, the at least one millimeter-wave antenna 33 may include one or more directional and/or omnidirectional antennas so as to be readily installed on the top portion, the left side and/or the right side of the casing 34 of the expansion device 3 to transmit and receive millimeter-wave signals. Therefore, the direction and quality of signal transmission of the antenna can be optimized.

More specifically, when the electronic device 2 is fastened on the expansion device 3, the port 22 of the first waveguide connection port 21 and the port 32 of the second waveguide connection port 31 are correspondingly connected such that the first waveguide connection port 21 and the second waveguide connection port 31 form a waveguide (tube or cavity) to transmit and receive millimeter-wave signals. Therefore, attenuation of millimeter-wave signals can be reduced.

In conclusion, with the expansion device and the multiple waveguide connection ports used in the millimeter wave communication apparatus provided by the present invention, a millimeter-wave antenna can be placed on the expansion device, and a waveguide can be formed by the multiple waveguide connection ports to transmit millimeter-wave signals. Therefore, the issues of space limitations in the design of the millimeter-wave antenna as well as the attenuation of millimeter-wave signals can be avoided.

While the present invention has been disclosed by way of the embodiments above, it shall be understood that the present invention is not limited thereto. Modifications and variations can be made to the embodiments by a person skilled in the art without departing from the spirit and scope of the present invention. Therefore, the scope of legal protection of the present invention should be defined by the appended claims.

What is claimed is:

1. A millimeter wave communication apparatus, comprising:
    an electronic device, comprising a first waveguide connection port and a millimeter wave communication module, wherein the first waveguide connection port is disposed on a casing of the electronic device, and the millimeter wave communication module is connected to the first waveguide connection port to transmit and receive millimeter-wave signals; and
    an expansion device, installed on a carrier, and comprising a second waveguide connection port and at least one millimeter-wave antenna, wherein the second waveguide connection port is disposed on a casing of the expansion device and corresponds to a position of the first waveguide connection port of the electronic device, the casing of the expansion device defines a first channel into which the electronic device is inserted when the electronic device is fastened on the expansion device, and the at least one millimeter-wave antenna is connected to the second waveguide connection port to transmit and receive the millimeter-wave signals;
    wherein, when the electronic device is fastened on the expansion device, the first waveguide connection port and the second waveguide connection port form a waveguide to transmit and receive the millimeter-wave signals.

2. The millimeter wave communication apparatus according to claim 1, wherein the electronic device is a tablet computer or a laptop computer.

3. The millimeter wave communication apparatus according to claim 1, wherein the expansion device has a fastening structure for securing the electronic device.

4. The millimeter wave communication apparatus according to claim 1, wherein the expansion device is fixed on the carrier.

5. The millimeter wave communication apparatus according to claim 1, wherein the at least one millimeter-wave antenna is installed on a top portion, a left side and a right side of the expansion device.

6. The millimeter wave communication apparatus according to claim 5, wherein the electronic device is positioned on a front side of the expansion device when the electronic device is fastened on the expansion device, wherein the front side is orthogonal to the top portion, the left side, and the right side of the expansion device.

7. The millimeter wave communication apparatus according to claim 1, wherein the first waveguide connection port has a first port, and the second waveguide connection port has a second port.

8. The millimeter wave communication apparatus according to claim 7, wherein when the electronic device is fastened on the expansion device, the first port of the first waveguide connection port and the second port of the second waveguide connection port are correspondingly connected such that the first waveguide connection port and the second waveguide connection port form the waveguide to transmit and receive the millimeter-wave signals.

9. The millimeter wave communication apparatus according to claim 1, wherein the expansion device extends from a first surface of the electronic device to a second surface of the electronic device opposite the first surface.

10. The millimeter wave communication apparatus according to claim 1, wherein the electronic device is configured to be slidably fastened on the expansion device by sliding the electronic device into the first channel of the expansion device.

11. The millimeter wave communication apparatus according to claim 1, wherein the first waveguide connection port is disposed on a first surface of the electronic device, a second surface of the electronic device contacts the casing of the expansion device when the electronic device is fastened on the expansion device, and the first surface is diametrically opposite the second surface.

12. The millimeter wave communication apparatus according to claim 11, wherein a third surface of the electronic device contacts the casing of the expansion device when the electronic device is fastened on the expansion device, and the third surface is orthogonal to the first surface and the second surface.

13. The millimeter wave communication apparatus according to claim 12, wherein a fourth surface of the electronic device partially contacts the casing of the expansion device when the electronic device is fastened on the expansion device, and the fourth surface is diametrically opposite the third surface.

14. The millimeter wave communication apparatus according to claim 1, wherein the casing of the expansion device defines a second channel into which the electronic device is inserted when the electronic device is fastened on the expansion device, and the electronic device is positioned between the first channel and the second channel when the electronic device is fastened on the expansion device.

15. A millimeter wave communication apparatus, comprising:
an electronic device, comprising a first waveguide connection port and a millimeter wave communication module, wherein the first waveguide connection port is disposed on a casing of the electronic device, and the millimeter wave communication module is connected to the first waveguide connection port to transmit and receive millimeter-wave signals; and
an expansion device, installed on a carrier, and comprising a second waveguide connection port and at least one millimeter-wave antenna, wherein the second waveguide connection port is disposed on a casing of the expansion device and corresponds to a position of the first waveguide connection port of the electronic device, and the at least one millimeter-wave antenna is connected to the second waveguide connection port to transmit and receive the millimeter-wave signals;
wherein, when the electronic device is fastened on the expansion device, the first waveguide connection port and the second waveguide connection port form a waveguide to transmit and receive the millimeter-wave signals and the expansion device extends from a first surface of the electronic device to a second surface of the electronic device opposite the first surface.

16. The millimeter wave communication apparatus according to claim 15, wherein the second waveguide connection port is disposed between a wall of the expansion device defining a bottom of a channel into which the electronic device is inserted when the electronic device is fastened on the expansion device and a bottom wall of the expansion device.

17. The millimeter wave communication apparatus according to claim 15, wherein the at least one millimeter-wave antenna is disposed on a top portion of the expansion device.

18. A millimeter wave communication apparatus, comprising:
an electronic device, comprising a first waveguide connection port and a millimeter wave communication module, wherein the first waveguide connection port is disposed on a casing of the electronic device, the millimeter wave communication module is connected to the first waveguide connection port to transmit and receive millimeter-wave signals, and the first waveguide connection port is disposed on a first surface of the electronic device; and
an expansion device, installed on a carrier, and comprising a second waveguide connection port and at least one millimeter-wave antenna, wherein the second waveguide connection port is disposed on a casing of the expansion device and corresponds to a position of the first waveguide connection port of the electronic device, and the at least one millimeter-wave antenna is connected to the second waveguide connection port to transmit and receive the millimeter-wave signals;
wherein, when the electronic device is fastened on the expansion device, the first waveguide connection port and the second waveguide connection port form a waveguide to transmit and receive the millimeter-wave signals and a second surface of the electronic device contacts the casing of the expansion device, and wherein the first surface is diametrically opposite the second surface.

19. The millimeter wave communication apparatus according to claim 18, wherein a third surface of the electronic device contacts the casing of the expansion device when the electronic device is fastened on the expansion device, and the third surface is orthogonal to the first surface and the second surface.

20. The millimeter wave communication apparatus according to claim 19, wherein a fourth surface of the electronic device partially contacts the casing of the expansion device when the electronic device is fastened on the expansion device, and the fourth surface is diametrically opposite the third surface.

\* \* \* \* \*